US005571572A

United States Patent [19]

Sandhu

[11] Patent Number: 5,571,572
[45] Date of Patent: *Nov. 5, 1996

[54] METHOD OF DEPOSITING TITANIUM CARBONITRIDE FILMS ON SEMICONDUCTOR WAFERS

[75] Inventor: Gurtej S. Sandhu, Boise, Id.

[73] Assignee: Micron Technology, Inc., Boise, Id.

[*] Notice: The term of this patent shall not extend beyond the expiration date of Pat. No. 5,246,881.

[21] Appl. No.: 269,957

[22] Filed: Jun. 30, 1994

Related U.S. Application Data

[63] Continuation of Ser. No. 971,943, Nov. 5, 1992, abandoned, and a continuation-in-part of Ser. No. 755,202, Sep. 5, 1991, Pat. No. 5,192,589.

[51] Int. Cl.$^6$ .............................. C23C 8/00; C23C 16/00
[52] U.S. Cl. .................. 427/585; 427/255; 427/255.1
[58] Field of Search ............................. 427/255.1, 255, 427/585

[56] References Cited

U.S. PATENT DOCUMENTS

| | | | |
|---|---|---|---|
| 3,807,008 | 4/1974 | Reedy, Jr. ................................. | 29/195 |
| 4,784,874 | 11/1988 | Ishihara et al. ........................ | 427/585 |
| 4,830,886 | 5/1989 | Cito et al. ................................ | 427/249 |
| 4,842,897 | 6/1989 | Takeuchi et al. ..................... | 427/255.2 |
| 5,087,593 | 2/1992 | Narula ...................................... | 501/96 |
| 5,089,438 | 2/1992 | Katz ........................................ | 437/184 |
| 5,135,607 | 8/1992 | Hirai ....................................... | 156/643 |
| 5,139,825 | 8/1992 | Gordon et al. ........................ | 427/255.2 |
| 5,192,589 | 3/1993 | Sandhu ................................. | 427/255.1 |
| 5,246,881 | 9/1993 | Sandhu et al. ........................ | 437/192 |

OTHER PUBLICATIONS

Katz, "Ohmic Contact to InP–Based Materials Induced by Means of Rapid Thermal Low Pressure (Metallorganic) Chemical Vapor Deposition Technique", Jnl. of Ele. Materials, vol. 20, No. 12, pp. 1069–1073 (1991).

Katz et al., "The Influence Of Ammonia On Rapid Thermal Low–Pressure Metallorganic Chemical Vapor Depsoited TiNx Films From Tetrakis (dimethylamido) Titanium Precursor Onto InP", Journal of Applied Physics, 71(2), pp. 993–1000, Jan. 15, 1992.

*Primary Examiner*—Shrive Beck
*Assistant Examiner*—Brian K. Talbot
*Attorney, Agent, or Firm*—Wells, St. John, Roberts, Gregory & Matkin, P.S.

[57] ABSTRACT

A chemical vapor deposition method of providing a conformal layer of a titanium carbonitride atop a semiconductor wafer comprises: a) positioning a wafer within a chemical vapor deposition reactor; b) providing a source of an activated halogen species within the chemical vapor deposition reactor; c) injecting selected quantities of a gaseous titanium organometallic precursor and a carrier gas to within the reactor having the wafer positioned therein; and d) maintaining the reactor at a pressure of less than or equal to about 100 Torr and the wafer at a selected elevated temperature which in combination are effective for reaction of the precursor to bond carbon thereof with the activated halogen species and to deposit a film on the wafer which comprises a titanium nitride.

13 Claims, 2 Drawing Sheets

METHOD OF DEPOSITING TITANIUM CARBONITRIDE FILMS ON SEMICONDUCTOR WAFERS

RELATED PATENT DATA

This patent resulted from a continuation application of U.S. patent application Ser. No. 07/971,943, filed on Nov. 5, 1992 now abandoned, listing Gurtej S. Sandhu as the inventor, and entitled "Method Of Depositing Titanium Nitride Films On Semiconductor Wafers", which was abandoned in favor of the application from which this patent matured. This patent also resulted from a continuation-in-part application of U.S. patent application Ser. No. 07/755,202, filed on Sep. 5, 1991, also listing Gurtej S. Sandhu as the inventor, and entitled "Low-Pressure Chemical Vapor Deposition Process For Depositing Thin Titanium Nitride Films Having Low and Stable Resistivity", which became U.S. Pat. No. 5,192,589.

TECHNICAL FIELD

BACKGROUND OF THE INVENTION

In the processing of integrated circuits, electric contact must be made to isolated active device regions formed within a wafer/substrate. The active device regions are connected by high electrically conductive paths or lines which are fabricated above an insulator material, which covers the substrate surface. To provide electrical connection between the conductive path and active-device regions, an opening in the insulator is provided to enable the conductive films to contact the desired regions. Such openings are typically referred to as contact openings, or simply "contacts".

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductor runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive $SiO_2$ layer.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti in an Ar ambient and converting it to TiN in a separate plasma nitridation step; or e) by low pressure chemical vapor deposition.

As device dimensions continue to shrink, adequate step coverage within the contact has become problematical with respect to certain deposition techniques. Chemical vapor deposition is known to deposit highly conformal layers, and would be preferable for this reason in depositing into deep, narrow contacts. One example prior art technique for depositing TiN is by a low pressure chemical vapor deposition at pressures of less than 1 Torr. Specifically, an example is the reaction of a titanium organometallic precursor of the formula $Ti(N(CH_3)_2)_4$, commonly referred to as TMAT, and ammonia in the presence of a carrier gas according to the following formula:

$Ti(NR_2)_4 + NH_3 \rightarrow TiN + $ organic byproduct

It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity.

Additionally, it is believed that organic incorporation (specifically hydrocarbon incorporation) into the resultant film reduces density and increases resistivity. Such organic incorporation can result from carbon radicals from the organic portion of the precursor becoming incorporated into the film, as opposed to being expelled with the carrier gas.

One chemical vapor deposition method has been reported which results in reduced resistivity. Such is described in Katz, "*Ohmic Contacts To InP-Based Materials Induced By Means Of Rapid Thermal Low Pressure (Metalorganic) Chemical Vapor Deposition Technique*", Journal Of Electronic Materials, Vol. 20, No. 12, pp. 1069–73 (1991) and Katz et al., "*The Influence Of Ammonia On Rapid-Thermal Low-Pressure Metallorganic Chemical Vapor Deposited $TiN_x$ Films From Tetrakis (dimethylamido) Titanium Precursor Onto InP*", Journal Of Applied Physics, 71(2), pp. 993–1000, Jan. 15, 1992. This process utilizes rapid thermal low pressure chemical vapor deposition, in which a wafer is first placed in a reactor and the reactor is then sealed. The reactor is then evacuated, and reactive gases are then injected into the reactor which has a cold or unheated environment therein at this point in the process. Then heat is essentially instantly applied to the reactor environment to rapidly (within seconds) heat the wafer and reactor contents to the desired process temperature, thus the term "rapid thermal". Such processes, however, have not been implemented in a mass production environment.

It would be desirable to improve upon these and other prior art processes in developing a chemical vapor deposition process to provide a conformal layer of a conductive titanium nitride layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
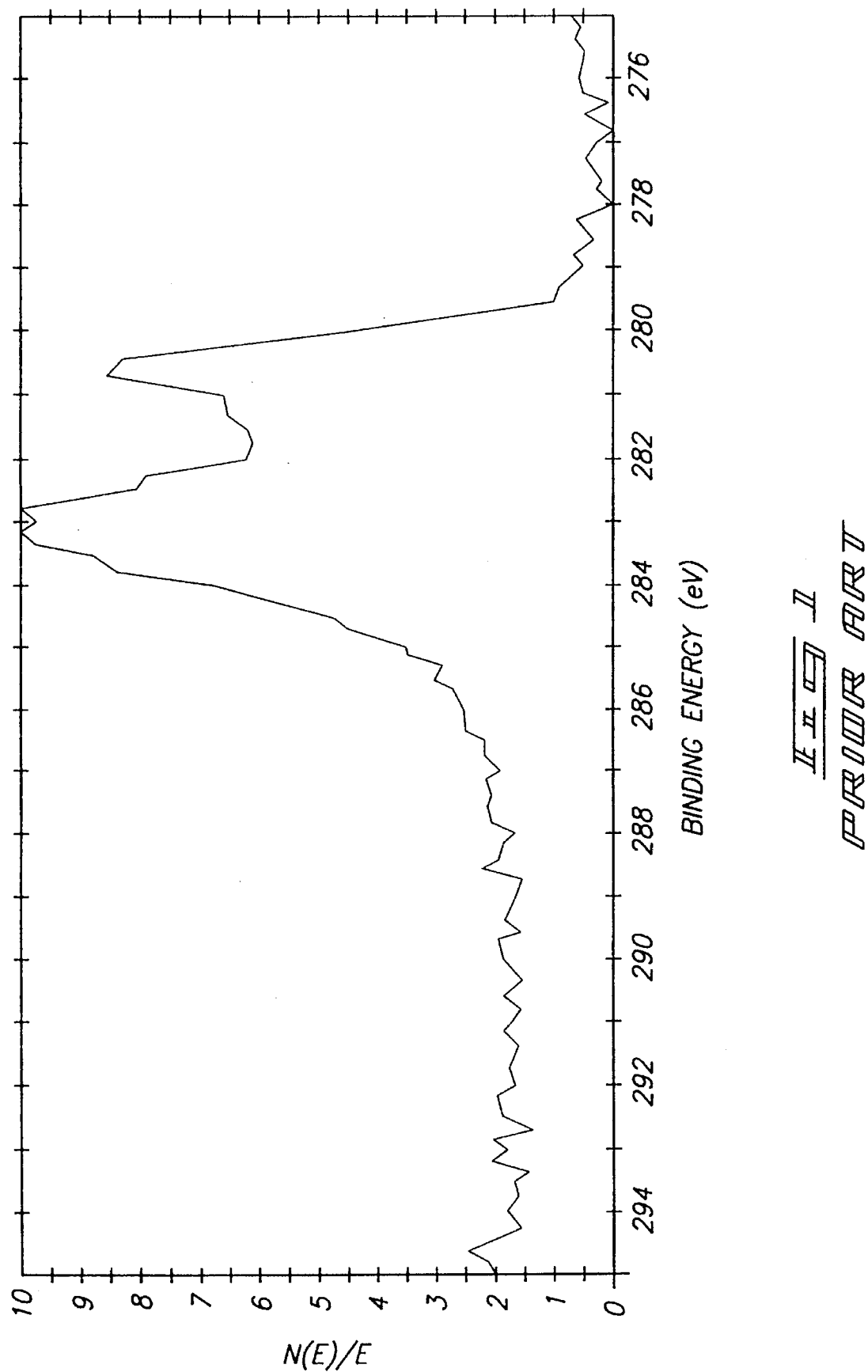
FIG. 1 is a photospectroscopy plot of bond occurrence versus bond energy for a process conducted in accordance with the prior art.

This disclosure of the invention is submitted in furtherance of the constitutional purposes of the U.S. Patent Laws "to promote the progress of science and useful arts" (Article 1, Section 8).

In accordance with the invention, a chemical vapor deposition method for providing a conformal layer of a titanium nitride atop a semiconductor wafer comprises:

positioning a wafer within a chemical vapor deposition reactor;

providing a source of an activated halogen species within the chemical vapor deposition reactor;

injecting selected quantities of a gaseous titanium organometallic precursor and a carrier gas to within the reactor having the wafer positioned therein; and maintaining the reactor at a pressure of less than or equal to about 100 Torr and the wafer at a selected elevated temperature which in combination are effective for reaction of the precursor to bond carbon thereof with the activated halogen species and to deposit a film on the wafer which comprises a titanium nitride.

Preferably, the reaction is conducted at very low pressures of less then or equal to about 1.0 Torr. A preferred titanium organometallic precursor comprises a compound of the formula $Ti(NR_2)_4$, where R comprises a carbon containing radical. An example is TMAT. Such is typically injected into a reactor by bubbling an inert gas, such as He, through TMAT liquid which vaporizes the TMAT which is then directed to the reactor. Other techniques for injecting TMAT gas into the reactor would include atomizing the TMAT liquid and injecting such liquid into the reactor which would essentially instantly vaporize into TMAT gas. Another technique for injecting TMAT gas into the reactor would be to provide TMAT in a solid form in the reactor, with the solid form subliming and thereby injecting TMAT gas into the reactor. Such techniques for providing TMAT to a reactor are known to people of skill in the art.

The preferred method, and the method by which the invention was reduced to practice, pretreats internal side walls of the chemical vapor deposition reactor with an activated halogen species to cause such species to bind or otherwise adsorb to the internal reactor side walls. Such side walls are typically made of metal, such as aluminum. At the effective reactor pressure and temperature, the precursor is believed to dissociate such that the organic portion(s) thereof withdraws the activated halogen species from the reactor side walls to bond a carbon atom or carbon atoms from the dissociated precursor with the withdrawn activated halogen species. The halogen-organic species then formed is expelled from the reactor with the flow of the carrier gas therethrough. In essence, the intent is to effectively drive the organic portion of the precursor away from the wafer surface to avoid organics/hydrocarbons from being incorporated into the deposited film. It is believed that the activated halogen species temporarily bound with the sidewalls tends to pull the organic away from the wafer surface upon precursor dissociation.

In this preferred manner, the step of providing a source of activated halogen species within the chemical vapor deposition reactor occurs even before the step of positioning the wafer within the chemical vapor deposition reactor. It is anticipated in accordance with this aspect of the invention, that the reactor would be subjected to an activated halogen species in-between each wafer treatment, assuming a batch process.

In accordance with the invention, the term "activated halogen species" means a halogen either in atomic or molecular form, wherein the subject halogen atom or the species in which the halogen is bound, is in an excited or activated state. It is not believed that an actual halogen atom itself necessarily has to be in an excited or activated state when the species comprises a molecular form having other atoms in addition to the halogen. Example activated halogen species would include ions, radicals and activated complexes. It is believed that essentially any metastable form of the halogen or halogen species would provide sufficient reactivity to getter or combine with a portion of the organic part of the titanium organometallic precursor to restrict hydrocarbon incorporation into the deposited film.

It is also believed that any of the halogens will produce the effect of increased density and reduced resistance. The invention was reduced to practice using fluorine as the halogen. Specifically, an Applied Materials™ 5000 W reactor was pretreated with no wafer therein with a an $NF_3$ gas flow of 300 standard cubic centimeters per minute (sccm) for 20 seconds. The reactor pressure was 1 Torr, and the reactor temperature was 400° C. The reactor was also subjected to 150 W of power to induce the $NF_3$ into a plasma state, thereby providing an activated halogen species within the reactor. Such plasma state results in production of ions and radicals, and most likely other excited or activated halogen species.

The step of actually later depositing a titanium nitride film in accordance with the invention was conducted using $Ti(N(CH_3)_2)_4$ (TMAT) as the titanium organometallic precursor. The reactive technique for depositing a titanium nitride was in accordance with the method of our copending and co-assigned U.S. patent application Ser. No. 07/898,059 entitled "Low-Pressure Chemical Vapor Deposition Process For Depositing Highly Conformal Titanium Carbonitride Barrier Films", which was filed on Jun. 12, 1992. Such application is hereby incorporated by reference. In accordance with such a method, the step of injecting the gases comprises injecting gases which consist essentially of the titanium organometallic precursor and the carrier gas. The carrier gas might comprise $N_2$, $H_2$, He, Ar, or others, or mixtures thereof. The reactor is maintained at a pressure and an elevated temperature which in combination are effective for producing a titanium nitride comprising $TiC_xN_y$. The preferred operable temperature range is from 200° C. to 500° C., with approximately 400° C. being most preferred. The preferred pressure range is from 0.1 Torr to 50 Torr, with about 0.5 Torr to 1.0 Torr being most preferred. The preferred flow rate of the organometallic precursor in a six liter, Applied Materials™ 5000 W CVD system is from 1 to 50 sccm. The preferred flow rate for the carrier gas is from 10 to 500 sccm. The preferred volumetric ratio of organometallic precursor to carrier gas is from 1:500 to 5:1.

It was discovered that the presence of the active fluorine species resulted in a dramatic improvement in the density and lowering of resistance in the deposited films by as much as ten times. Furthermore, the phenomenon was not observed if the reactor was pretreated with fluorine that was not in an activated form. For example, the control feed for reactor pretreatment was the feeding of $NF_3$ under the same temperature, pressure and flow rate conditions, but not inducing such material into the plasma state. Table 1 below illustrates the results from the fluorine pretreatment with plasma enhancing, and no plasma enhancing.

TABLE I

| Pretreatment Process | Rs (ohm/sq.) | Rs (24 hours) |
|---|---|---|
| No active F | 5000 | 24000 |
| Active F | 600 | 620 |

Example conditions included pressure maintained at 0.5 Torr, and wafer temperature maintained at 400° C. The organometallic precursor fed was TMAT at a rate of 5 sccm, with a carrier gas of He at a flow rate of 100 sccm. Such deposition was conducted for approximately 1 minute after reactor pretreatment with $NF_3$ plasma.

Auger analysis showed that oxygen content of the films was 8.3 times lower for films run with activated fluorine pretreatment, as compared to films run without the requisite active fluorine pretreatment. In general, oxygen also diffused into the films which were not deposited after active fluorine pretreatment of the reaction chamber. The presence of the activated halogen therefore enhances the density of the resultant films, as oxygen is not diffusing into the less porous films. In otherwords, the resistivity of films produced in accordance with the invention does not deteriorate over time from exposure to atmosphere.

Film analysis indicated that no pretreatment with an activated halogen species resulted in a film containing in excess of 20% carbon, half of which is in a hydrocarbon form, the remainder being material where carbon is bonded directly to Ti in accordance with the $TiC_xN_y$ form of a titanium nitride. However, with the reactor pretreatment in accordance with the invention, the carbon levels dropped down to 5% and the carbon incorporated in the film is only present as bonded to Ti. Absence of hydrocarbons in the films gives rise to significantly denser film which explains the lower resistance, less oxygen incorporation, and stability of the films in air.

It was determined that the fluorine species remaining behind on the reactor side walls after pretreatment must remain in some form of metastable, activated state. This determination was arrived at since feeding of $NF_3$ gas with the carrier and organometallic precursor gases during deposition results in no improvement in resistivity reduction or density maximization. Accordingly, it is not some non-activated form of the fluorine during actual deposition which resulted in the reduced resistance, increased density effect. Rather, some form of activated fluorine was required to produce the desired effect, and accordingly must have been in the reactor.

In accordance with another aspect of the invention, the organometallic precursor is reacted with $NH_3$ for producing the titanium nitride film. A preferred technique for doing so would be in accordance with the method described in U.S. Pat. No. 5,264,499 which incorporated by reference. In accordance with this aspect of the invention, the selected temperature is preferably from about 50° C. to 600° C., the preferred pressure is from about 5 Torr to about 100 Torr, and the further comprises the step of preheating the positioned wafer within the reactor to a selected processing temperature of from about 200° C. to about 600° C. prior to the step of injecting. Preferably here and typically in such instances, the resultant film will consist essentially of TiN, with the film having an excess of 99% TiN by volume.

Figure 2:
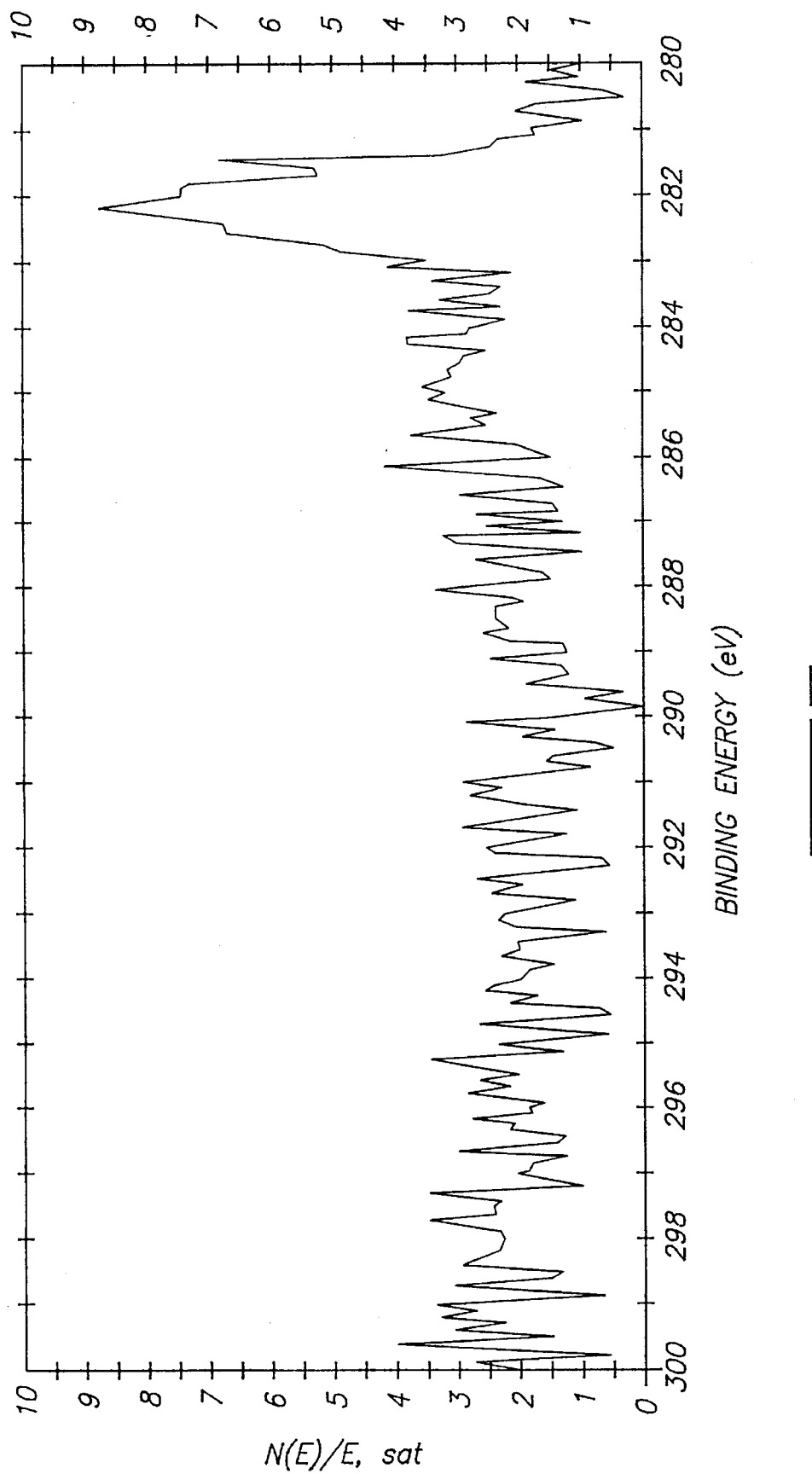
FIG. 2 is a photospectroscopy plot of bond occurrence versus bond energy for a process conducted in accordance with the invention.

Evidence of the invention is apparent from FIGS. 1 and 2, which are photospectroscopy plots of bond occurrence versus bond energy for processes conducted in accordance with the prior art and with the invention, respectively. As is apparent from the prior art FIG. 1 plot, two peaks are illustrated. The left peak evidences the undesired carbon-hydrogen bond problem, while the right peak evidences the desired titanium-carbon bonds of the titanium carbide film. However, FIG. 2 illustrates only a single peak for just the titanium-carbon bonds, with no appreciable carbon-hydrogen bonds being present. The subject deposited films utilized TMAT as the source gas for each of the above examples. Activated fluorine pretreatment of the reactor occurred with the FIG. 2 example.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A chemical vapor deposition method of providing a conformal layer of titanium carbonitride atop a semiconductor wafer, the method comprising the following steps:

prior to providing said titanium carbonitride conformal layer on a semiconductor wafer, pretreating internal sidewalls of a chemical vapor deposition reactor with an activated halogen species to cause such species to bind to the internal reactor sidewalls;

providing a wafer within the chemical vapor deposition reactor;

injecting quantities of a gaseous, carbon containing, titanium organometallic precursor and a carrier gas into the reactor having the semiconductor wafer positioned therein; and maintaining the reactor at a pressure of less than or equal to about 100 Torr and the semiconductor wafer at a temperature which in combination cause a reaction of the precursor to withdraw active halogenated species from the reactor sidewalls to bond carbon from the precursor with the withdrawn activated halogen species and to deposit a film on the semiconductor wafer which comprises titanium carbonitride, the deposited titanium carbnoitride film having less incorporated carbon than would otherwise be present were the activated halogen species not present in the chemical vapor deposition reactor during deposition.

2. The chemical vapor deposition method of claim 1 wherein the pressure is less than or equal to about 1 Torr.

3. The chemical vapor deposition method of claim 1 wherein the titanium organometallic precursor comprises a compound of the formula $Ti(NR_2)_4$, where R comprises a carbon containing radical.

4. The chemical vapor deposition method of claim 1 wherein the titanium organometallic precursor comprises $Ti(N(CH_3)_2)_4$.

5. The chemical vapor deposition method of claim 1 wherein the titanium organometallic precursor comprises $Ti(N(CH_3)_2)_4$, and the pressure is less than or equal to about 1 Torr.

6. The chemical vapor deposition method of claim 1 wherein the step of providing a source of activated halogen species within the chemical vapor deposition reactor occurs before the step of positioning the wafer within the chemical vapor deposition reactor.

7. The chemical vapor deposition method of claim 1 wherein the activated halogen species comprises a halogen containing ion.

8. The chemical vapor deposition method of claim 1 wherein the activated halogen species comprises a halogen containing radical.

9. The chemical vapor deposition method of claim 1 wherein the activated halogen species comprises a halogen containing activated complex.

10. The chemical vapor deposition method of claim 1 wherein the activated halogen species comprises fluorine.

11. The chemical vapor deposition method of claim 1 wherein the activated halogen species comprises fluorine, and the step of pretreating comprises providing an $NF_3$ plasma within the chemical vapor deposition reactor.

12. The chemical vapor deposition method of claim 1 wherein the step of injecting comprises also injecting a quantity of $NH_3$.

13. The chemical vapor deposition method of claim 12 wherein the temperature is from about 50° C. to 600° C., the pressure is from about 5 Torr to about 100 Torr, and further comprising the step of preheating the positioned wafer to a processing temperature of from about 200° C. to about 600° C. prior to the step of injecting.

\* \* \* \* \*